United States Patent
Tokunaga (10) Patent No.: US 11,244,820 B2
(45) Date of Patent: Feb. 8, 2022

(54) SUBSTRATE PROCESSING APPARATUS, SUBSTRATE PROCESSING METHOD, AND STORAGE MEDIUM

(71) Applicant: TOKYO ELECTRON LIMITED, Tokyo (JP)

(72) Inventor: Yoichi Tokunaga, Kumamoto (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 317 days.

(21) Appl. No.: 16/468,383

(22) PCT Filed: Nov. 30, 2017

(86) PCT No.: PCT/JP2017/043147
§ 371 (c)(1),
(2) Date: Jun. 11, 2019

(87) PCT Pub. No.: WO2018/110301
PCT Pub. Date: Jun. 21, 2018

(65) Prior Publication Data
US 2021/0257210 A1    Aug. 19, 2021

(30) Foreign Application Priority Data

Dec. 12, 2016    (JP) .............................. JP2016-240142

(51) Int. Cl.
*H01L 21/02*    (2006.01)
*B08B 3/04*    (2006.01)
(Continued)

(52) U.S. Cl.
CPC ........ *H01L 21/02087* (2013.01); *B08B 3/041* (2013.01); *B08B 3/08* (2013.01);
(Continued)

(58) Field of Classification Search
CPC ......... H01L 21/02087; H01L 21/67248; H01L 21/67051; H01L 21/67259; H01L 21/67253
See application file for complete search history.

(56) References Cited

U.S. PATENT DOCUMENTS

2009/0087542 A1\* 4/2009 Sasaki ............... H01L 21/67288
427/8
2015/0318192 A1\* 11/2015 Ito ..................... H01L 21/67248
438/748

(Continued)

FOREIGN PATENT DOCUMENTS

JP    2005203440 A  \*  7/2005  ......... H01L 21/6715
JP    2013168429 A        8/2013

*Primary Examiner* — Natasha N Campbell
(74) *Attorney, Agent, or Firm* — Nath, Goldberg & Meyer; Jerald L. Meyer; Tanya E. Harkins (57) ABSTRACT

There is provided a substrate processing apparatus including: a rotatable holding part configured to rotate a substrate while holding the substrate; a liquid supply part configured to supply a processing liquid to a peripheral edge portion of the substrate held by the rotatable holding part; a sensor configured to detect a temperature distribution at the peripheral edge portion; and a controller configured to execute an operation of detecting a boundary portion between a region of the peripheral edge portion to which the processing liquid adheres and a region of the peripheral edge portion to which the processing liquid does not adhere, based on the temperature distribution.

9 Claims, 8 Drawing Sheets

(51) Int. Cl.
*B08B 3/08* (2006.01)
*H01L 21/67* (2006.01)
*H01L 21/687* (2006.01)
*H01L 21/66* (2006.01)

(52) U.S. Cl.
CPC .. *H01L 21/67051* (2013.01); *H01L 21/67248* (2013.01); *H01L 21/68764* (2013.01); *H01L 22/20* (2013.01)

(56) References Cited

U.S. PATENT DOCUMENTS

2016/0148366 A1* 5/2016 Amano .................. G06T 7/0008
                                                              348/87
2018/0161828 A1* 6/2018 Yang .................. H01L 21/67253

* cited by examiner

SUBSTRATE PROCESSING APPARATUS, SUBSTRATE PROCESSING METHOD, AND STORAGE MEDIUM

TECHNICAL FIELD

The present disclosure relates to a substrate processing apparatus, a substrate processing method, and a storage medium.

BACKGROUND

Patent Document 1 discloses a liquid processing apparatus for supplying a processing liquid to remove a film on a peripheral edge portion of the substrate. The liquid processing apparatus images the peripheral edge portion subjected to the liquid process, measures a removal width of the film based on the imaging result, and moves the supply position of the processing liquid to adjust the removal width of the film.

PRIOR ART DOCUMENT

Patent Document

Patent Document 1: Japanese laid-open publication No. 2013-168429

In the configuration of Patent Document 1, after completing the liquid process on at least one substrate, it is necessary to measure the removal width using the substrate. Therefore, in a case where the measurement result of the removal width falls outside an allowable range or the like, there is a possibility that the substrate used for the measurement of the removal width cannot be effectively used. Thus, the present disclosure provides some embodiments of a substrate processing apparatus and a substrate processing method, which are capable of detecting information on a region subjected to liquid process during execution of the liquid process, and a storage medium therefor.

SUMMARY

According to an embodiment of the present disclosure, there is provided a substrate processing apparatus including: a rotatable holding part configured to rotate a substrate while holding the substrate; a liquid supply part configured to supply a processing liquid to a peripheral edge portion of the substrate held by the rotatable holding part; a sensor configured to detect a temperature distribution at the peripheral edge portion; and a controller configured to execute an operation of detecting a boundary portion between a region of the peripheral edge portion to which the processing liquid adheres and a region of the peripheral edge portion to which the processing liquid does not adhere, based on the temperature distribution.

According to the present disclosure, it is possible to detect information on a region subjected to liquid process during execution of the liquid process.

DETAILED DESCRIPTION

Embodiments of the present disclosure will now be described in detail with reference to the accompanying drawings. In the following description, the same elements or the elements having the same function are denoted by like reference numerals, and the redundant description thereof will be omitted.

Figure 1:
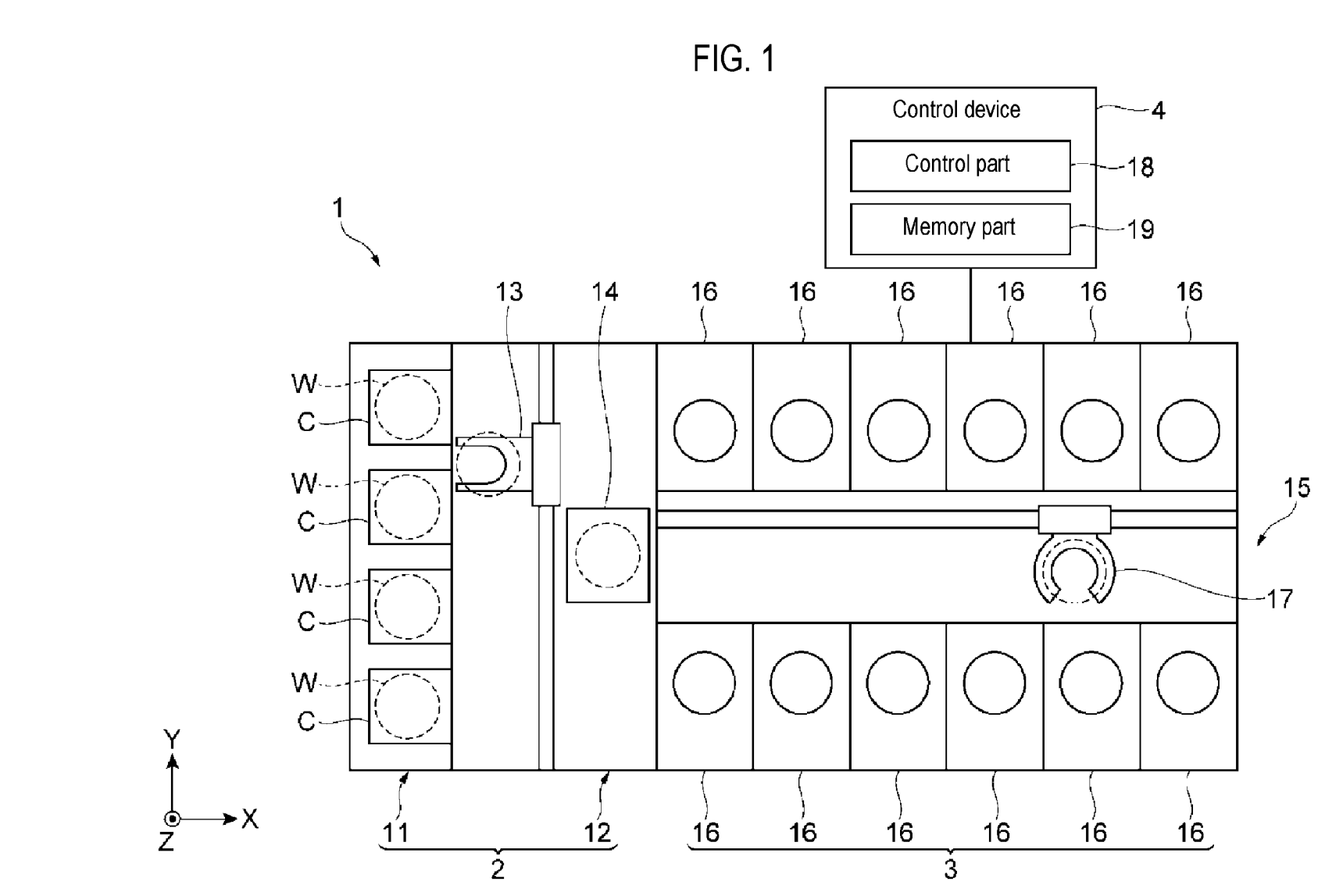
FIG. 1 is a view showing a schematic configuration of a substrate processing system according to the present embodiment.

FIG. 1 is a view showing a schematic configuration of a substrate processing system according to the present embodiment. In the following description, for the clarification of a positional relationship, an X axis, a Y axis and a Z axis orthogonal to one another are defined. A positive direction of the Z axis is defined as a vertical upward direction. As shown in FIG. 1, the substrate processing system 1 includes a loading/unloading station 2 and a processing station 3. The loading/unloading station 2 and the processing station 3 are provided adjacent to each other.

The loading/unloading station 2 includes a carrier stage 11 and a transfer part 12. A plurality of carriers C each for horizontally accommodating a plurality of substrates C, e.g., semiconductor wafers (hereinafter referred to as "wafers W") in the present embodiment, is mounted on the carrier stage 11.

The transfer part 12 is provided adjacent to the carrier stage 11 and includes a substrate transfer device 13 and a delivery part 14 disposed therein. The substrate transfer device 13 includes a wafer holding mechanism that holds the wafer W. In addition, the substrate transfer device 13 can move in a horizontal direction and a vertical direction and can swing about a vertical axis. The substrate transfer device 13 transfers the wafer W between the carrier C and the delivery part 14 using the wafer holding mechanism.

The processing station 3 is provided adjacent to the transfer part 12. The processing station 3 includes a transfer part 15 and a plurality of processing units 16. The processing units 16 are provided side by side on both sides of the transfer part 15.

The transfer part 15 includes a substrate transfer device 17 disposed therein. The substrate transfer device 17 includes a wafer holding mechanism that holds the wafer W. Furthermore, the substrate transfer device 17 can move in a horizontal direction and a vertical direction and can swing about a vertical axis. The substrate transfer device 17 transfers the wafer W between the delivery part 14 and the processing units 16 using the wafer holding mechanism.

The processing unit 16 performs a predetermined substrate process on the wafer W transferred by the substrate transfer device 17.

The substrate processing system 1 further includes a control device 4. The control device 4 is, for example, a computer, and includes a control part 18 and a memory part 19. The memory part 19 stores a program for controlling various processes performed in the substrate processing system 1. The control part 18 controls the operation of the substrate processing system 1 by reading and executing the program stored in the memory part 19.

The program is recorded in a computer-readable storage medium and may be installed on the memory part 19 of the control device 4 from the storage medium. Examples of the computer-readable storage medium include a hard disk (HD), a flexible disk (FD), a compact disk (CD), a magnet optical disk (MO), a memory card and the like.

In the substrate processing system 1 configured as above, first, the substrate transfer device 13 of the loading/unloading station 2 takes out the wafer W from the carrier C mounted on the carrier stage 11 and mounts the taken-out wafer W on the delivery part 14. The wafer W mounted on the delivery part 14 is taken out from the delivery part 14 by the substrate transfer device 17 of the processing station 3 and is loaded into the processing unit 16.

The wafer W loaded into the processing unit 16 is processed by the processing unit 16. Thereafter, the wafer W is unloaded from the processing unit 16 by the substrate transfer device 17 and is mounted on the delivery part 14. Then, the processed wafer W mounted on the delivery part 14 is returned to the carrier C of the carrier stage 11 by the substrate transfer device 13.

[Substrate Processing Apparatus]

Next, a configuration of a substrate processing apparatus 10 included in the substrate processing system 1 will be described. The substrate processing apparatus 10 uses, as a processing target, the wafer W having a film F formed thereon, and performs a process of removing a portion located on a peripheral edge portion We of the wafer W (a portion near the peripheral edge) in the film F. Specific examples of the film F include a protective film containing SiN, and the like.

Figure 2:
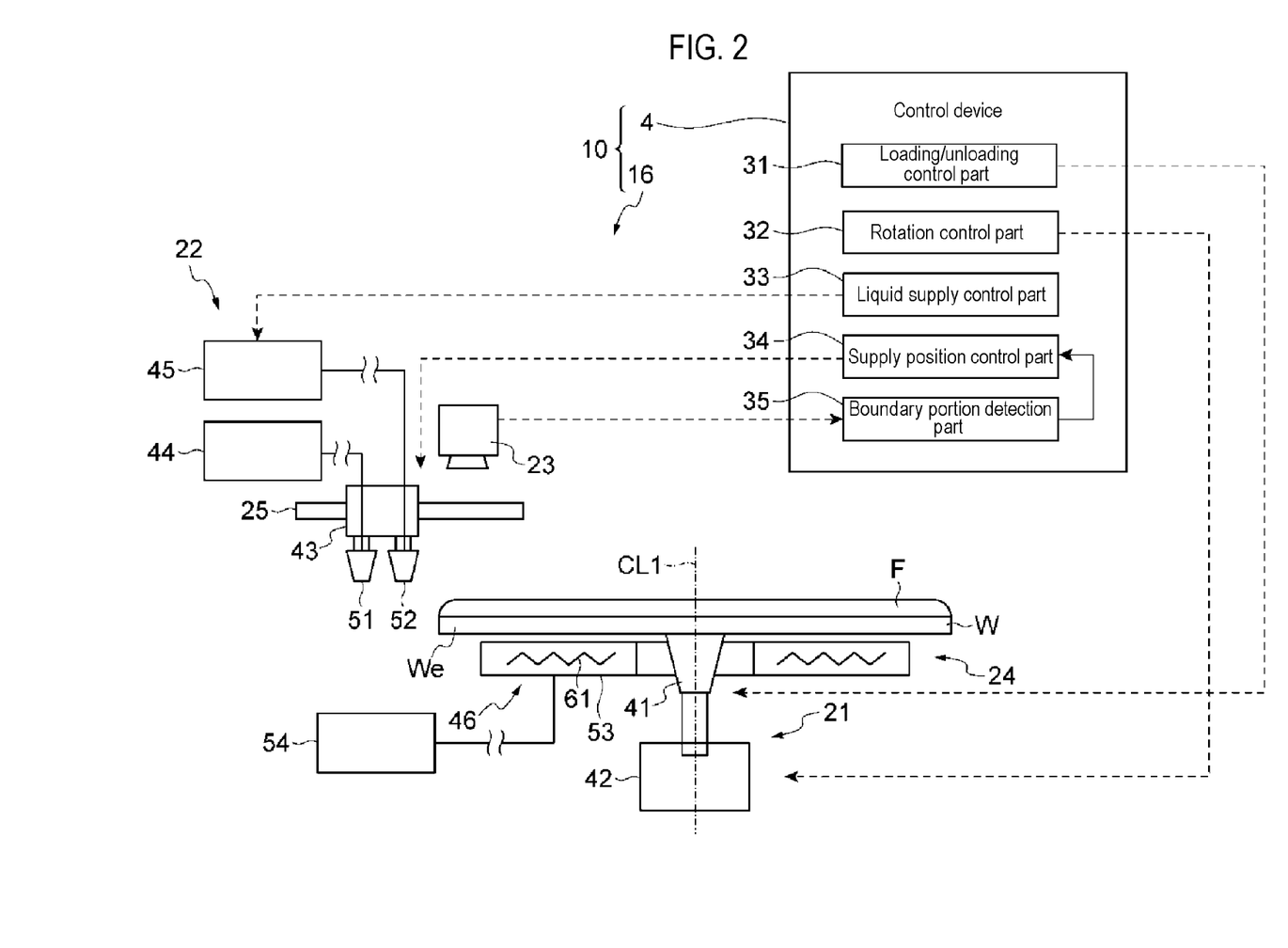
FIG. 2 is a schematic view showing a schematic configuration of a substrate processing apparatus.
Figure 3:
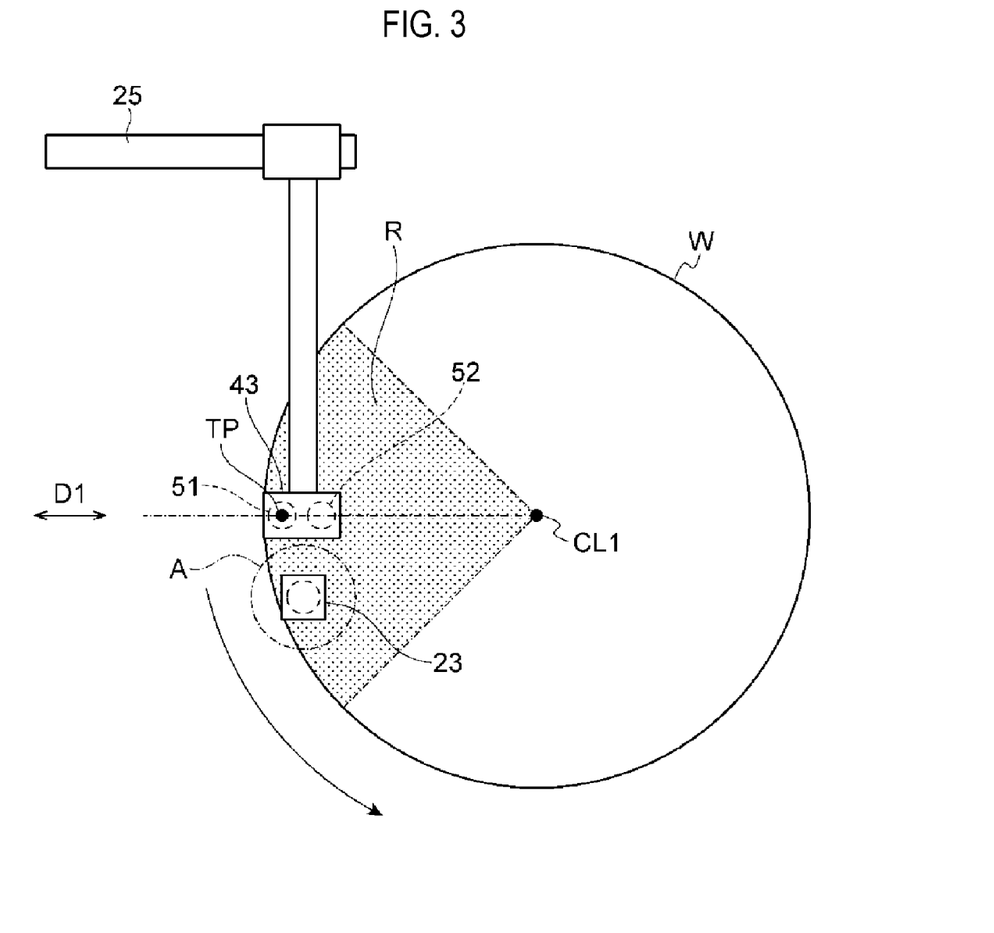
FIG. 3 is a plan view of a processing unit shown in FIG. 2.

FIG. 2 is a schematic view showing a schematic configuration of the substrate processing apparatus 10. FIG. 3 is a plan view of the processing unit 16 shown in FIG. 2. As shown in FIGS. 2 and 3, the substrate processing apparatus 10 includes the processing unit 16 and the control device 4 configured to control the processing unit 16. The processing unit 16 includes a rotatable holding part 21, a liquid supply part 22, a sensor 23, a temperature adjusting part 24, and a position adjusting part 25.

The rotatable holding part 21 rotates the wafer W while holding the wafer W. For example, the rotatable holding part 21 includes a holder 41 and a rotation driver 42. The holder 41 supports the central portion of the wafer W disposed horizontally with the film F thereof facing upward and holds the wafer W by, for example, vacuum suction. The rotation driver 42 is an actuator using, for example, an electric motor as a power source, and is configured to rotate the holder 41 and the wafer W about a vertical axis line (hereinafter referred to as "central axis line CL1"). Hereinafter, an upper surface of the wafer W held by the holder 41 will be referred to as a "front surface", and a lower surface thereof will be referred to as a "rear surface".

The liquid supply part 22 supplies a processing liquid toward the peripheral edge portion We of the wafer W held by the rotation driver 42. For example, the liquid supply part 22 includes a nozzle unit 43, a chemical liquid source 44 and a rinsing liquid source 45.

The nozzle unit 43 includes a chemical liquid nozzle 51 and a rinsing liquid nozzle 52. The chemical liquid nozzle 51 discharges a processing liquid (hereinafter referred to as "chemical liquid") for dissolution of the film F downward (including obliquely downward). Specific examples of the chemical liquid include an alkaline chemical liquid, an acidic chemical liquid, and the like. Specific examples of the alkaline chemical liquid include a mixed solution of ammonia, hydrogen peroxide and pure water (SC-1 solution). Specific examples of the acidic chemical liquid include a mixed solution of hydrofluoric acid and pure water (HF solution), and the like. The rinsing liquid nozzle 52 discharges a processing liquid (hereinafter referred to as "rinsing liquid") for washing away the chemical liquid and the dissolved component of the film F downward (including obliquely downward). Specific examples of the rinsing liquid include pure water (DIW), and the like.

The chemical liquid source 44 supplies a chemical liquid to the chemical liquid nozzle 51. For example, the chemical liquid source 44 includes a tank for storing the chemical liquid, and a pump for forcibly feeding the chemical liquid from the tank to the chemical liquid nozzle 51. The rinsing liquid source 45 supplies a rinsing liquid to the rinsing liquid nozzle 52. For example, the rinsing liquid source 45 includes a tank for storing the rinsing liquid, and a pump for forcibly feeding the rinsing liquid from the tank to the rinsing liquid nozzle 52.

In some embodiments, the liquid supply part 22 may be configured to supply plural types of chemical liquids from the chemical liquid nozzle 51. For example, the liquid supply part 22 may include a plurality of chemical liquid sources 44 and may be configured to switch the chemical liquid sources 44 so as to supply the respective chemical liquids to the chemical liquid nozzle 51, using a valve or the like.

The sensor 23 detects a temperature distribution at the peripheral edge portion We of the wafer W. For example, the sensor 23 detects a distribution of temperature at one region on the peripheral edge side of the front surface of the wafer W (hereinafter referred to as "detection target region A"). For example, the sensor 23 includes an infrared camera disposed above the detection target region A, and detects a temperature distribution in the detection target region A by allowing an imaging part to focus the infrared light generated from the detection target region A.

The sensor 23 may be disposed in any manner as long as both a region to which the processing liquid adheres and a region to which the processing liquid does not adhere are included in the peripheral edge portion We. As an example, the sensor 23 is provided so as to detect a temperature distribution in the detection target region A located in the rotational direction of the wafer W in the vicinity of a position TP where the processing liquid reaches the wafer W. The vicinity of the position TP means a sector falling within a range of ±45 degrees (range R in FIG. 3) with respect to the position TP in terms of an angle around the central axis line CL1. The rotational direction of the wafer W in the vicinity of the position TP means a direction in which a portion of the wafer W located in the vicinity of the position TP moves along with the rotation of the wafer W. For example, when the wafer W rotates counterclockwise (in the direction of an arrow) in FIG. 3, the direction in which the position TP moves is downward in FIG. 3.

The temperature adjusting part 24 increases a difference in temperature between the processing liquid before adhering to the wafer W and the wafer W. For example, the temperature adjusting part 24 includes a heating part 46 configured to heat the wafer W. The heating part 46 includes a main body 53 and a gas source 54. The main body 53 is annularly provided to surround the holder 41 and is disposed to face the rear surface of the wafer W. The main body 53 incorporates a heater 61 such as, for example, a heating wire or the like. The main body 53 discharges an inert gas such as $N_2$ or the like heated by the heater 61 toward the rear surface of wafer W. The gas source 54 supplies the main body 53 with the inert gas. A position to which the inert gas is supplied by the gas source 54 is set such that a region heated by the supply of the inert gas includes an adhesion region of the processing liquid and becomes wider than the adhesion region.

Depending on the type of the processing liquid supplied from the chemical liquid nozzle 51, the removal rate of the film F may be increased by heating. In such a case, according to the heating part 46 that heats the wafer W, it is possible not only to increase the temperature difference but also to promote the liquid process (the process of removing the film F by the processing liquid).

In addition, the temperature adjusting part 24 may have any configuration as long as it can increase the temperature difference. For example, the temperature adjusting part 24 may include a cooling part configured to cool the wafer W. When the wafer W is cooled, the removal rate is reduced. However, for example, in a case where a film different in type from the film F is additionally stacked on the wafer W, a film removal selectivity between the additionally-stacked film and the film F to be removed may be improved in some cases.

The temperature adjusting part 24 may be configured to heat or cool the processing liquid instead of the wafer W. In the case where the temperature adjusting part 24 heats the processing liquid, as in the case of heating the wafer W, it is possible not only to increase the temperature difference but also to promote the liquid process (the process of removing the film F by the processing liquid). However, there is also a possibility that bubbles are generated in the processing liquid by heating. If it is necessary to avoid the generation of bubbles caused by the heating, it is effective to heat the wafer W as described above and to raise the temperature of the processing liquid after coming into contact with the wafer W.

The position adjusting part 25 adjusts the position TP at which the processing liquid reaches the wafer W in a direction D1 intersecting (for example, orthogonal to) the central axis line CL1. For example, the position adjusting part 25 is configured to move the nozzle unit 43 along the direction D1 using an electric motor or the like as a power source. In some embodiments, the position adjusting part 25 may be configured to move the wafer W along the direction D1.

The control device 4 that controls the processing unit 16 is configured to execute an operation of detecting a boundary portion between the region of the peripheral edge portion We to which the processing liquid adheres and the region of the peripheral edge portion We to which the processing liquid does not adhere, based on the aforementioned temperature distribution. After detecting the boundary portion, the control device 4 may be configured to further control the position adjusting part 25 based on the detected position of the boundary portion to adjust the position TP at which the processing liquid reaches the wafer W, in the course of supplying the processing liquid to the wafer W.

For example, the control device 4 includes a loading/unloading control part 31, a rotation control part 32, a liquid supply control part 33, a supply position control part 34 and a boundary portion detection part 35 as functional configurations for controlling the processing unit 16 (hereinafter referred to as "functional modules"). These functional modules are controlled in cooperation between the control part 18 and the memory part 19 of the control device 4.

The loading/unloading control part 31 controls the substrate transfer device 17 to load/unload the wafer W into/from the processing unit 16, and controls the rotatable holding part 21 to switch the holding and release of the wafer W by the holder 41. The rotation control part 32 controls the rotatable holding part 21 so that the wafer W is rotated by the rotation driver 42. The liquid supply control part 33 controls the liquid supply part 22 so as to supply the processing liquid to the peripheral edge portion We of the wafer W from the chemical liquid nozzle 51 or the rinsing liquid nozzle 52. The supply position control part 34 controls the position adjusting part 25 to adjust the position TP at which the processing liquid reaches the wafer W. The boundary portion detection part 35 detects the boundary portion between the region of the peripheral edge portion We to which the processing liquid adheres and the region of the peripheral edge portion We to which the processing liquid does not adhere, based on the aforementioned temperature distribution.

[Substrate Processing Method]

Hereinafter, the substrate processing procedure performed by the processing unit 16 will be described as an example of the substrate processing method. The substrate processing procedure is automatically performed in accordance with a control procedure executed by the control device 4.

Figure 4:
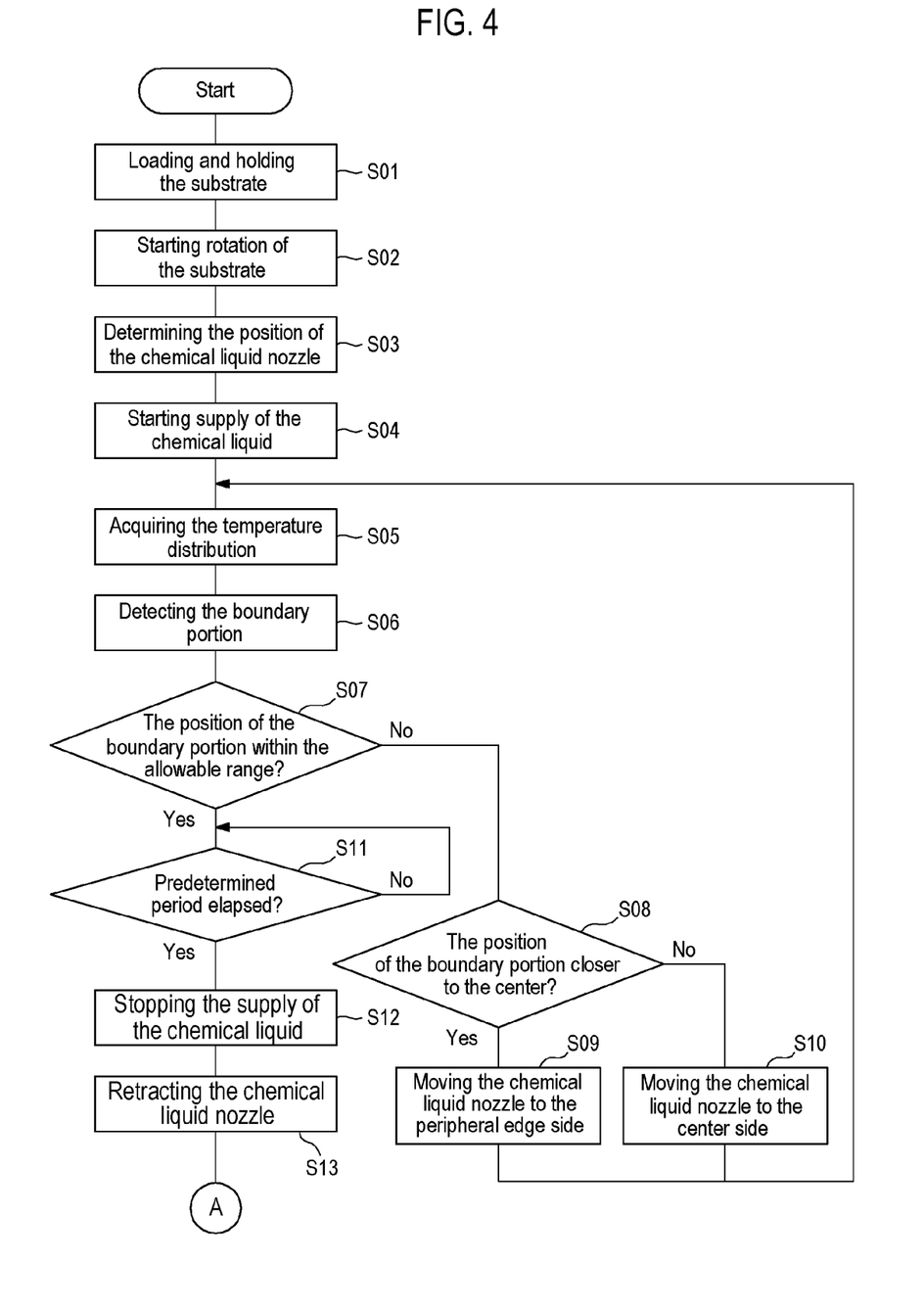
FIG. 4 is a flowchart showing a substrate processing procedure.
Figure 5:
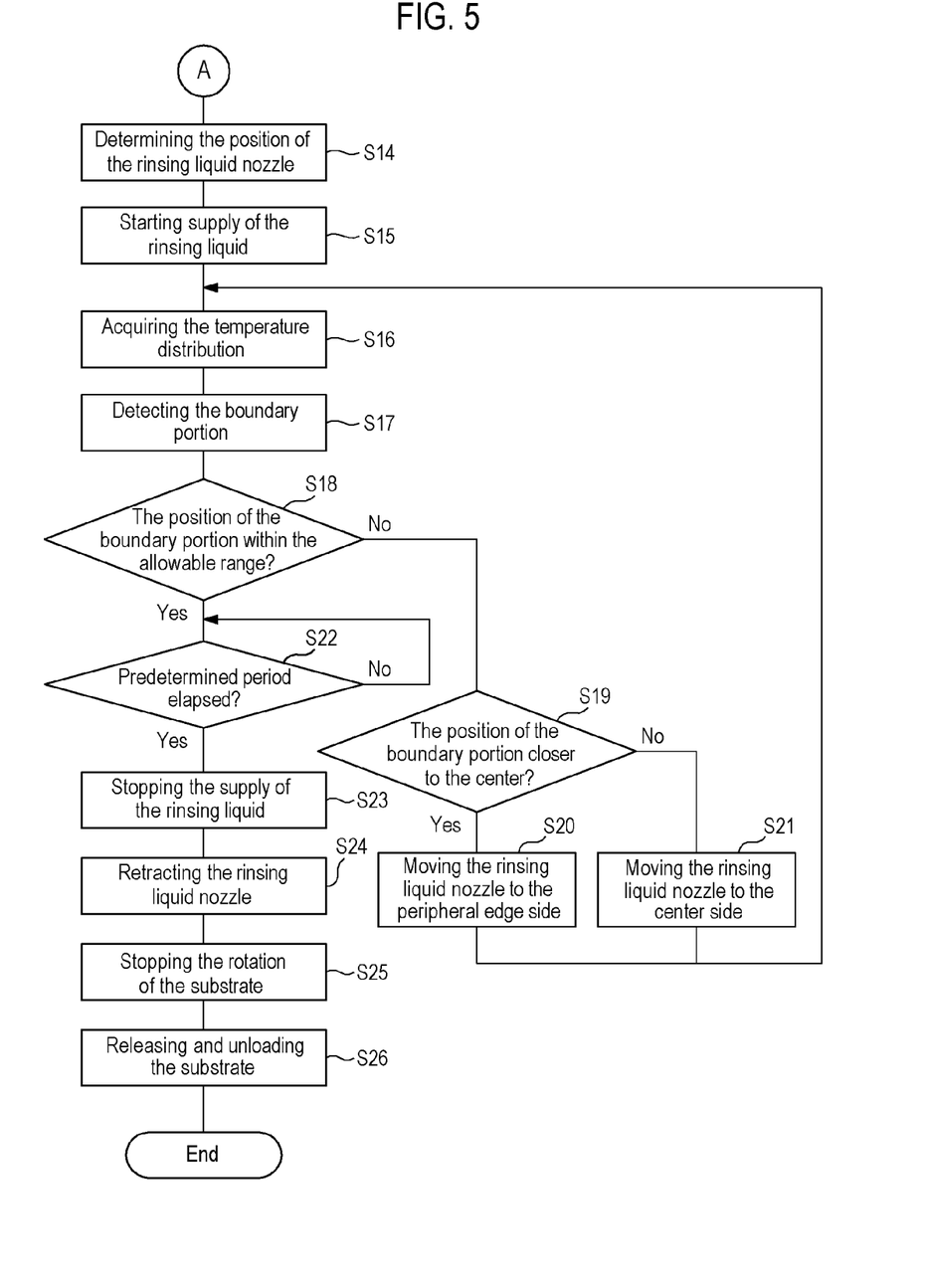
FIG. 5 is a flowchart showing the substrate processing procedure.
Figure 6A:
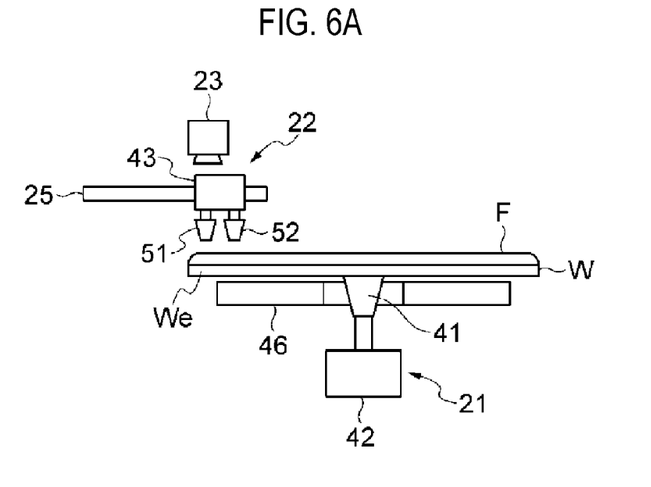
FIGS. 6A and 6B are schematic views showing a state in which a chemical liquid is supplied to a wafer W.
Figure 6B:
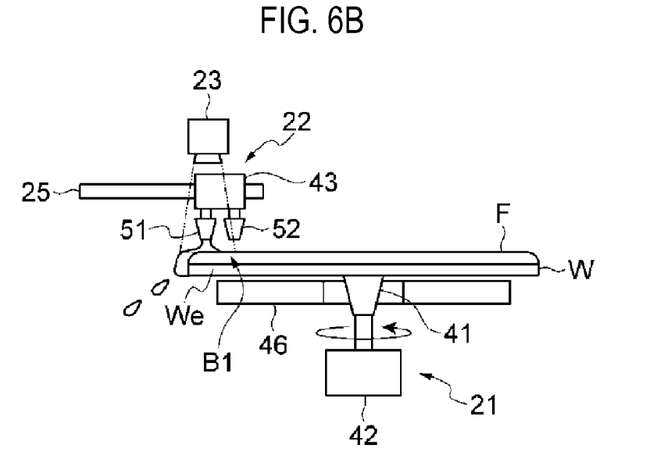
Figure 7A:
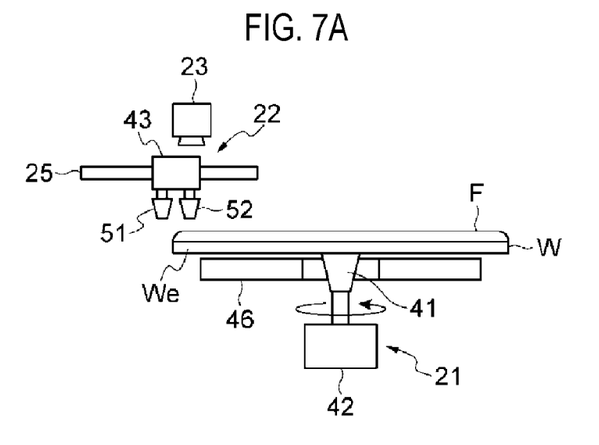
FIGS. 7A, 7B and 7C are schematic views showing a state in which a rinsing liquid is supplied to the wafer W.
Figure 7B:
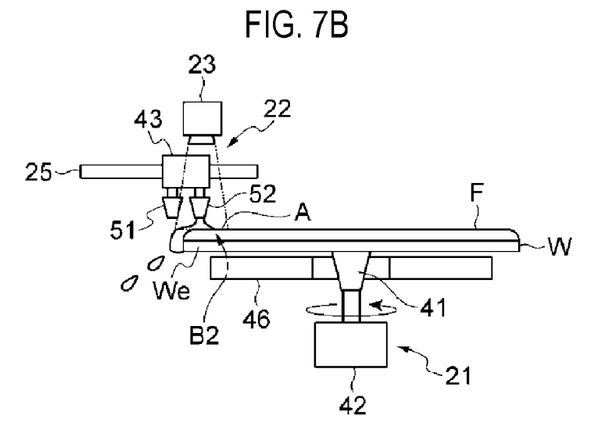
Figure 7C:
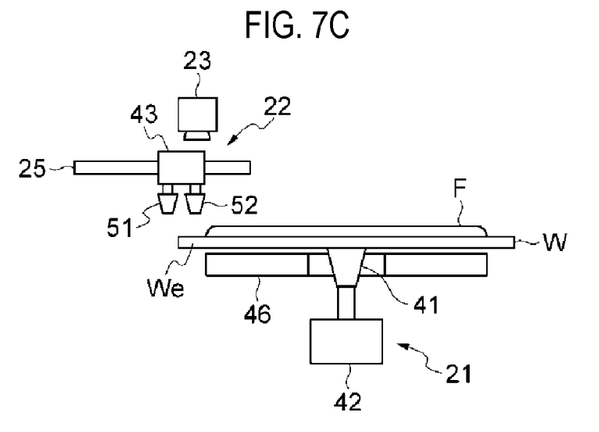

FIGS. 4 and 5 are flowcharts showing the substrate processing procedure. FIG. 6 is a schematic view showing a state in which a chemical liquid is supplied onto the wafer W. FIG. 7 is a schematic view showing a state in which a rinsing liquid is supplied onto the wafer W.

As shown in FIG. 4, the control device 4 first executes step S01. In step S01, the loading/unloading control part 31 controls the substrate transfer device 17 to load the wafer W into the processing unit 16, and controls the rotatable holding part 21 to hold the wafer W by the holder 41. More specifically, the loading/unloading control part 31 loads the wafer W into the processing unit 16 in a horizontal posture with the film F facing upward, and controls the substrate transfer device 17 so as to place the central portion of the wafer W on the holder 41. Thereafter, the loading/unloading control part 31 controls the holder 41 so as to hold the central portion of the wafer W.

The wafer W held by the holder 41 is heated by the heating part 46. That is to say, the operation of loading the wafer W into the processing unit 16 and holding the wafer W by the holder 41 corresponds to an example of the operation of increasing the temperature difference between the processing liquid before adhering to the wafer W and the wafer W.

Subsequently, the control device 4 executes step S02. In step S02, the rotation control part 32 controls the rotatable holding part 21 to start the rotation of the wafer W by the rotation driver 42.

Subsequently, the control device 4 executes step S03. In step S03, the supply position control part 34 controls the position adjusting part 25 to move the nozzle unit 43 and place the chemical liquid nozzle 51 above the peripheral edge portion We of the wafer W (see FIG. 6A).

Subsequently, the control device 4 executes step S04. In step S04, the liquid supply control part 33 controls the liquid supply part 22 to start the discharge of the chemical liquid from the chemical liquid nozzle 51. Thus, the chemical liquid is supplied to the peripheral edge portion We of the wafer W under rotation (see FIG. 6B).

Subsequently, the control device 4 executes step S05. In step S05, the boundary portion detection part 35 controls the sensor 23 to detect a temperature distribution at the peripheral edge portion We of the wafer W, and acquires a detection result. The sensor 23 detects the temperature distribution in the detection target region A located in the rotational direction of the wafer W in the vicinity of the position TP where the chemical liquid reaches the wafer W.

Subsequently, the control device 4 executes step S06. In step S06, the boundary portion detection part 35 detects a boundary portion B1 between the region of the peripheral edge portion We to which the chemical liquid adheres and the region of the peripheral edge portion We to which the chemical liquid does not adhere, based on the temperature distribution detected in step S05 (see FIG. 6B). For example, the boundary portion detection part 35 detects, as the boundary portion B1, a boundary portion in the detection target region A between a region where the temperature is higher than a predetermined threshold value and a region where the temperature is lower than the predetermined threshold value. The threshold value may be appropriately set by experiments or simulations in advance.

Subsequently, the control device 4 controls the position adjusting part 25 to adjust the position TP at which the chemical liquid reaches the wafer W, based on the position of the boundary portion B1. For example, the control device 4 first executes step S07. In step S07, the supply position control part 34 confirms whether or not the position of the boundary portion B1 in the detection target region A falls within an allowable range. The allowable range is a range between a position closest to the peripheral edge side of the wafer W under the condition that the film F can be sufficiently removed and a position closest to the center side of the wafer W under the condition that the film F required in a subsequent step can remain.

If it is determined in step S07 that the position of the boundary portion B1 is out of the allowable range, the control device 4 executes step S08. In step S08, the supply position control part 34 confirms whether the position of the boundary portion B1 is closer to the center of the wafer W with respect to the allowable range.

If it is determined in step S08 that the position of the boundary portion B1 is closer to the center of the wafer W with respect to the allowable range, the control device 4 executes step S09. In step S09, the supply position control part 34 controls the position adjusting part 25 so as to move the chemical liquid nozzle 51 to the peripheral edge side of the wafer W.

If it is determined in step S08 that the position of the boundary portion B1 is not close to the center of the wafer W with respect to the allowable range (if it is determined in step S08 that the position of the boundary portion B1 is close to the peripheral edge of the wafer W), the control device 4 executes step S10. In step S10, the supply position control part 34 controls the position adjusting part 25 so as to move the chemical liquid nozzle 51 to the center side of the wafer W.

After executing step S09 or step S10, the control device 4 returns the process to step S05. Thereafter, the detection of the boundary portion B1 and the adjustment of the position of the chemical liquid nozzle 51 are repeated until the position of the boundary portion B1 falls within the allowable range.

If it is determined in step S07 that the position of the boundary portion B1 falls within the allowable range, the control device 4 executes step S11. In step S11, the liquid supply control part 33 waits for a predetermined period of time. The predetermined period of time is set in advance under a previously presented condition.

Subsequently, the control device 4 executes steps S12 and S13. In step S12, the liquid supply control part 33 controls the liquid supply part 22 to stop the discharge of the chemical liquid from the chemical liquid nozzle 51. In step S13, the supply position control part 34 controls the position adjusting part 25 so as to retract the chemical liquid nozzle 51 outward of the peripheral edge of the wafer W. The control device 4 may execute step S13 prior to step S12.

Subsequently, as shown in FIG. 5, the control device 4 executes step S14. In step S14, the supply position control part 34 controls the position adjusting part 25 so that the nozzle unit 43 is moved to place the rinsing liquid nozzle 52 above the peripheral edge portion We of the wafer W (see FIG. 7A).

Subsequently, the control device 4 executes step S15. In step S15, the liquid supply control part 33 controls the liquid supply part 22 to start the discharge of the rinsing liquid from the rinsing liquid nozzle 52. As a result, the rinsing liquid is supplied to the peripheral edge portion We of the wafer W under rotation (see FIG. 7B).

Subsequently, the control device 4 executes steps S16 and S17. In step S16, the boundary portion detection part 35 acquires a temperature distribution in the peripheral edge portion We in the same manner as in step S05. In step S17, as in step S06, the boundary portion detection part 35 detects a boundary portion B2 between a region of the peripheral edge portion We to which the rinsing liquid adheres and a region of the peripheral edge portion We to which the rinsing liquid does not adhere (see FIG. 7B).

Subsequently, the control device 4 controls the position adjusting part 25 to adjust a position TP at which the rinsing liquid reaches the wafer W, based on the detected position of the boundary portion B2. This procedure includes steps S18, S19, S20 and S21 which are similar to steps S07, S08, S09 and S10. In addition, an allowable range of the position of the boundary portion B1 used in step S18 may differ from the allowable range used in step S07. For example, the allowable range in step S18 may be set closer to the center of the wafer W than the allowable range in step S07 in order to thoroughly rinse out the processing liquid with the rinsing liquid.

If it is determined in step S18 that the position of the boundary portion B2 falls within the allowable range, the control device 4 executes step S22. In step S22, the liquid supply control part 33 waits for a predetermined period of time. The predetermined period of time is set in advance under a previously presented condition.

Subsequently, the control device 4 executes steps S23 and S24. In step S23, the liquid supply control part 33 controls the liquid supply part 22 to stop the discharge of the rinsing liquid from the rinsing liquid nozzle 52. In step S24, the supply position control part 34 controls the position adjusting part 25 so as to retract the rinsing liquid nozzle 52 outward of the peripheral edge of the wafer W. The control device 4 may execute step S24 prior to step S23.

Subsequently, the control device 4 executes step S25. In step S25, the rotation control part 32 controls the rotatable holding part 21 so as to stop the rotation of the wafer W by the rotation driver 42. By the steps so far described, the portion of the film F located on the peripheral edge portion We of the wafer W is removed (see FIG. 7C).

Subsequently, the control device 4 executes step S26. In step S26, the loading/unloading control part 31 controls the rotatable holding part 21 to release the holding of the wafer W by the holder 41, and controls the substrate transfer device 17 so as to unload the wafer W from the interior of the processing unit 16. Thus, the substrate processing procedure by the processing unit 16 is completed.

In the above description, the procedure of supplying the rinsing liquid after supplying one type of chemical liquid to the peripheral edge portion We has been exemplified. However, the present disclosure is not limited thereto. The control device 4 may control the processing unit 16 so as to supply the rinsing liquid after sequentially supplying plural types of chemical liquids to the peripheral edge portion We.

[Effects of the Present Embodiment]

As described above, the substrate processing apparatus 10 includes the rotatable holding part 21 configured to rotate the wafer W while holding the wafer W, the liquid supply part 22 configured to supply the processing liquid to the peripheral edge portion We of the wafer W held by the rotatable holding part 21, the sensor 23 configured to detect the temperature distribution at the peripheral edge portion We, and the control device 4 configured to execute the operation of detecting the boundary portions B1 and B2 between the region of the peripheral edge portion We to which the processing liquid adheres and the region of the peripheral edge portion We to which the processing liquid does not adhere, based on the detected temperature distribution.

In the substrate processing apparatus 10, the liquid process (the process of removing the film F) is performed on the region to which the processing liquid adheres. Therefore, by detecting the boundary portions B1 and B2, it is possible to obtain a boundary portion between a region to be subjected to the liquid process (hereinafter referred to as "processing target region") and the remaining region. However, on a visible light image, there is a possibility that the boundary portions B1 and B2 cannot be clearly detected because the contrast between the region to which the processing liquid adheres and the region to which the processing liquid does not adhere is weak. In contrast, according to the temperature distribution, a difference between the region to which the processing liquid adheres and the region to which the processing liquid does not adhere is clearly manifested.

Figure 8:
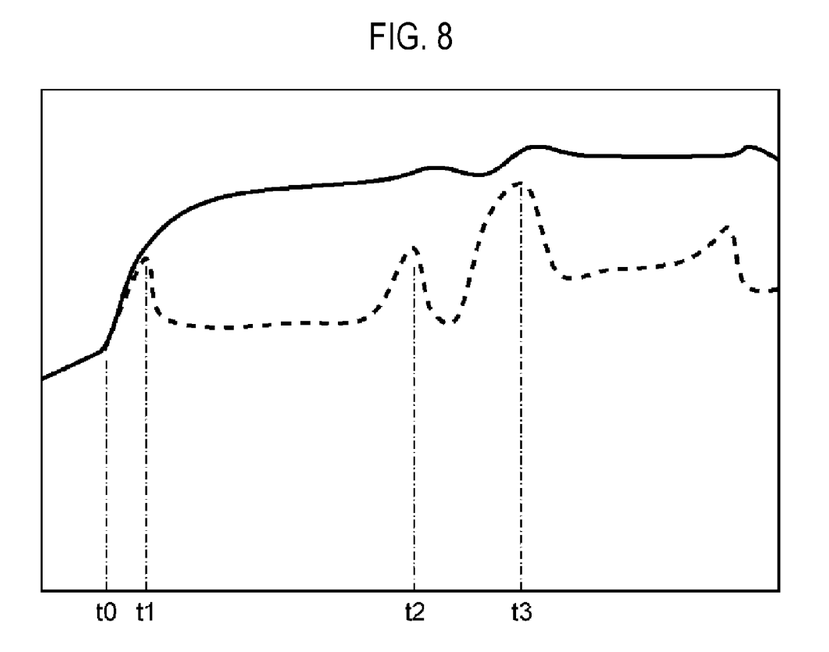
FIG. 8 is a graph showing a time-dependent change in temperature of a peripheral edge portion of a wafer.

FIG. 8 is a graph showing a time-dependent change in temperature at the peripheral edge portion of the wafer. A solid line data in FIG. 8 indicates the transition of the temperature (hereinafter referred to as a "first temperature") in the region of the peripheral edge portion We to which the processing liquid does not adhere. A broken line data in FIG. 8 indicates the transition of the temperature (hereinafter referred to as a "second temperature") in the region of the peripheral edge portion We to which the processing liquid adheres.

In addition, in FIG. 8, there is shown data available when the rinsing liquid is supplied after sequentially supplying two types of chemical liquids to the peripheral edge portion We. After time t0 at which the wafer W is disposed on the holder 41, both the first temperature and the second temperature rise along with the heating performed by the heating part 46. After time t1 at which the first type of chemical liquid reaches the peripheral edge portion We, the first temperature continues to rise and the second temperature falls, whereby the difference between the first temperature and the second temperature is increased. Although the second temperature rises after the supply of the first type of chemical liquid is stopped, the second temperature drops again after time t2 at which the second type of chemical liquid reaches the peripheral edge portion We. Although the second temperature rises even after the supply of the second type of chemical liquid is stopped, the second temperature drops again after time t3 at which the rinsing liquid reaches the peripheral edge portion We.

As is apparent from the graph, according to the temperature distribution, the difference between the region to which the processing liquid adheres and the region to which the processing liquid does not adhere is clarified. Therefore, it is possible to detect the boundary portions B1 and B2 with high reliability. Accordingly, the information regarding the region to be subjected to liquid process can be detected during the execution of the liquid process.

Thus, it is possible to adjust the position TP (the position where the processing liquid reaches the wafer W) during the execution of liquid process and to suppress generation of the wafer W in which the width of the processed region (the region from which the film F is removed) is out of the allowable range. Moreover, the present disclosure is not limited to the case where the position TP is adjusted in real time. The detected information may be first recorded and then may be reflected in a subsequent process. For example, the position TP may be adjusted using a dummy wafer W on which the film F is not formed.

The substrate processing apparatus 10 further includes the temperature adjusting part 24 configured to increase the temperature difference between the processing liquid before adhering to the wafer W and the wafer W. In this case, the difference between the region to which the processing liquid adheres and the region to which the processing liquid does not adhere is made clearer. It is therefore possible to detect the boundary portions B1 and B2 with higher reliability.

The temperature adjusting part 24 includes the heating part 46 configured to heat the wafer W. In this case, the temperature adjusting part 24 may also be used to promote the liquid process by heating.

The sensor 23 is provided so as to detect the temperature distribution in the detection target region A located in the rotational direction of the wafer W in the vicinity of the position where the processing liquid reaches the wafer W. In this case, after the processing liquid reaches one point of the peripheral edge portion We of the wafer W, the temperature distribution in the region including the point is immediately detected. As a result, the difference between the region to which the processing liquid adheres and the region to which the processing liquid does not adhere is made clearer. It is therefore possible to detect the boundary portions B1 and B2 with higher reliability.

The substrate processing apparatus 10 further includes the position adjusting part 25 configured to adjust the position at which the processing liquid reaches the wafer W. After detecting the boundary portions B1 and B2, the control device 4 is configured to further control the position adjusting part 25 to adjust the position TP at which the processing liquid reaches the wafer W based on the detected position of the boundary portions B1 and B2, in the course of supplying the processing liquid to the wafer W. In this case, by adjusting the liquid process region during the execution of liquid process, it is possible to suppress generation of the wafer W in which the width of the processed region (the region from which the film F is removed) is out of the allowable range.

While the embodiment has been described above, the present disclosure is not necessarily limited to the above-described embodiment. Various modifications may be made without departing from the spirit of the present disclosure. For example, the substrate to be processed is not limited to the semiconductor wafer and may be, for example, a glass substrate, a mask substrate, an FPD (Flat Panel Display), or the like.

Supplementary notes regarding the above embodiment will be described below.

(Supplementary Note 1)

A substrate processing apparatus includes:

a rotatable holding part configured to rotate a substrate while holding the substrate;

a liquid supply part configured to supply a processing liquid to a peripheral edge portion of the substrate held by the rotatable holding part;

a sensor configured to detect a temperature distribution at the peripheral edge portion; and a controller configured to execute an operation of detecting a boundary portion between a region of the peripheral edge portion to which the processing liquid adheres and a region of the peripheral edge portion to which the processing liquid does not adhere, based on the temperature distribution.

(Supplementary Note 2)

The apparatus of Supplementary Note 1 further includes: a temperature adjusting part configured to increase a temperature difference between the processing liquid before adhering to the substrate and the substrate.

(Supplementary Note 3)

The apparatus of Supplementary Note 2, wherein the temperature adjusting part includes a heater configured to heat the substrate.

(Supplementary Note 4)

The apparatus of any one of Supplementary Notes 1 to 3, wherein the sensor is configured to detect a temperature distribution in a region located in a rotational direction of the substrate in a vicinity of a position where the processing liquid reaches the substrate.

(Supplementary Note 5)

The apparatus of any one of Supplementary Notes 1 to 4, further includes: a position adjusting part configured to adjust a position where the processing liquid reaches the substrate, wherein, after detecting the boundary portion, the controller is configured to further control the position adjusting part to adjust the position where the processing liquid reaches the substrate, based on a position of the boundary portion, while the liquid supply part supplies the processing liquid to the substrate.

(Supplementary Note 6)

A substrate processing method includes:

holding and rotating a substrate;

supplying a processing liquid to a peripheral edge portion of the substrate under rotation;

detecting a temperature distribution at the peripheral edge portion; and detecting a boundary portion between a region of the peripheral edge portion to which the processing liquid adheres and a region of the peripheral edge portion to which the processing liquid does not adhere, based on the temperature distribution.

(Supplementary Note 7)

The method of Supplementary Note 6, further includes: increasing a temperature difference between the processing liquid before adhering to the substrate and the substrate.

(Supplementary Note 8)

The method of Supplementary Note 7, wherein the increasing the temperature difference between the processing liquid before adhering to the substrate and the substrate includes heating the substrate.

(Supplementary Note 9)

The method of any one of Supplementary Notes 6 to 8, wherein the detecting the temperature distribution at the peripheral edge portion includes detecting a temperature distribution in a region located in a rotational direction of the substrate in a vicinity of a position where the processing liquid reaches the substrate.

(Supplementary Note 10)

The method of any one of Supplementary Notes 6 to 9, further includes: after detecting the boundary portion, adjusting the position where the processing liquid reaches the substrate, based on a position of the boundary portion, while supplying the processing liquid to the substrate.

(Supplementary Note 11)

A computer-readable storage medium stores a program for causing an apparatus to execute the method of any one of Supplementary Notes 6 to 10.

EXPLANATION OF REFERENCE NUMERALS

4: control device, 10: substrate processing apparatus, W: wafer (substrate), We: peripheral edge portion, 21: rotatable holding part, 22: liquid supply part, 23: sensor, 24; temperature adjusting part, 25: position adjusting part, 46: heating part

What is claimed is:

1. A substrate processing apparatus comprising:
    a rotatable holder configured to rotate a substrate while holding the substrate;
    a liquid supplier including a nozzle and configured to supply a processing liquid to a peripheral edge portion of the substrate held by the rotatable holder;
    a sensor configured to detect a temperature distribution at the peripheral edge portion;
    a controller configured to execute an operation of detecting a boundary portion between a region of the peripheral edge portion to which the processing liquid adheres and a region of the peripheral edge portion to which the processing liquid does not adhere, based on the temperature distribution; and
    a position adjusting part configured to adjust a position where the processing liquid reaches the substrate,
    wherein, after detecting the boundary portion, the controller is configured to further control the position adjusting part to adjust the position where the processing liquid reaches the substrate, based on a position of the boundary portion, while the liquid supplier supplies the processing liquid to the substrate.

2. The apparatus of claim 1, further comprising:
    a temperature adjusting part configured to increase a temperature difference between the processing liquid before adhering to the substrate and the substrate.

3. The apparatus of claim 2, wherein the temperature adjusting part includes a heater configured to heat the substrate.

4. The apparatus of claim 1, wherein the sensor is configured to detect a temperature distribution in a region located in a rotational direction of the substrate in a vicinity of a position where the processing liquid reaches the substrate.

5. A substrate processing method comprising:
    holding and rotating a substrate;
    supplying a processing liquid to a peripheral edge portion of the substrate under rotation;
    detecting a temperature distribution at the peripheral edge portion;
    detecting a boundary portion between a region of the peripheral edge portion to which the processing liquid adheres and a region of the peripheral edge portion to which the processing liquid does not adhere, based on the temperature distribution; and after detecting the boundary portion, adjusting the position where the processing liquid reaches the substrate, based on a position of the boundary portion, while supplying the processing liquid to the substrate.

6. The method of claim 5, further comprising:

increasing a temperature difference between the processing liquid before adhering to the substrate and the substrate.

7. The method of claim 6, wherein the increasing the temperature difference between the processing liquid before adhering to the substrate and the substrate includes heating the substrate.

8. The method of claim 5, wherein the detecting the temperature distribution at the peripheral edge portion includes detecting a temperature distribution in a region located in a rotational direction of the substrate in a vicinity of a position where the processing liquid reaches the substrate.

9. A computer-readable storage medium storing a program for causing an apparatus to execute the method of claim 5.

* * * * *